United States Patent
Chang (10) Patent No.: US 7,924,946 B2
(45) Date of Patent: Apr. 12, 2011

(54) METHOD FOR RECOVERING A BASEBAND SIGNAL FROM AN RF SIGNAL

(75) Inventor: Yum-Cheng Chang, Mission Viejo, CA (US)

(73) Assignee: Fitipower Integrated Technology, Inc., Science Based Industrial Park, Hsinchu (TW)

( * ) Notice: Subject to any disclaimer, the term of this patent is extended or adjusted under 35 U.S.C. 154(b) by 800 days.

(21) Appl. No.: 11/853,822

(22) Filed: Sep. 12, 2007

(65) Prior Publication Data
US 2009/0067544 A1 Mar. 12, 2009

(51) Int. Cl.
*H04L 27/06* (2006.01)
*H03D 1/24* (2006.01)

(52) U.S. Cl. .......................................... 375/316; 375/321

(58) Field of Classification Search ................ 375/136, 375/147, 260, 270–271, 277, 316–317, 321; 348/725–726; 455/130, 324, 334, 47, 203–204; 332/167, 170
See application file for complete search history.

(56) References Cited

U.S. PATENT DOCUMENTS

| | | | | |
|---|---|---|---|---|
| 5,570,137 | A * | 10/1996 | Goeckler | 348/726 |
| 6,148,047 | A | 11/2000 | Mohindra | |
| 7,433,417 | B2 * | 10/2008 | Tirry et al. | 375/270 |
| 7,542,100 | B2 * | 6/2009 | Yee et al. | 348/726 |
| 2001/0040932 | A1 | 11/2001 | Lindquist | |
| 2004/0157571 | A1 * | 8/2004 | Wortel et al. | 455/131 |
| 2005/0243217 | A1 * | 11/2005 | Yun et al. | 348/725 |
| 2005/0243219 | A1 * | 11/2005 | Yun et al. | 348/725 |
| 2006/0017856 | A1 * | 1/2006 | Sheng et al. | 348/725 |
| 2007/0140382 | A1 * | 6/2007 | Qian | 375/332 |
| 2008/0158433 | A1 * | 7/2008 | Yun et al. | 348/725 |

FOREIGN PATENT DOCUMENTS

| | | |
|---|---|---|
| CN | 1269092 A | 10/2000 |
| CN | 1413387 A | 4/2003 |

\* cited by examiner

*Primary Examiner* — Tesfaldet Bocure
*Assistant Examiner* — Lawrence B Williams
(74) *Attorney, Agent, or Firm* — Winston Hsu; Scott Margo (57) ABSTRACT

By shifting an RF signal to IQ components of a modulated baseband signal directly, the zero-IF technology and IQ interface are applied in ATSC, NTSC, and PAL systems, and VSB and SSB modulations. The mathematic calculations are based on Fourier transform for shifting the RF signal and for recovering a baseband signal from the modulated baseband signal.

10 Claims, 7 Drawing Sheets

METHOD FOR RECOVERING A BASEBAND SIGNAL FROM AN RF SIGNAL

BACKGROUND OF THE INVENTION

1. Field of the Invention

The present invention relates to a method for recovering baseband signals of ATSC (Advanced Television Systems Committee) system, NTSC (National Television System Committee) system, PAL (Phase Alternating Line) system, VSB (Vestigial Side Band) system, and SSB (Single Side Band) system from RF signals, and more particularly, a method for recovering ATSC/NTSC/PAL/VSB/SSB baseband signals directly down from RF signals by Zero IF or Direct Down Conversion without through the IF—Intermediate Frequency and passband (IF) filtering.

2. Description of the Prior Art

In the past, a super heterodyne method for demodulation applied in ATSC, NTSC, PAL, VSB and SSB in which signals only occupy a portion of double sideband needs a sharp passband (IF) filter to remove the signal of an adjacent channel before recovering a modulated signal. In the modulation process of ATSC/NTSC/PAL/VSB/SSB according to the prior art, first the redundant half of a symmetrical signal in a frequency domain is removed by an L/C circuit or a saw filter. The advantage of removing the redundant half of the symmetrical signal is that the same channel bandwidth, can be sent twice.

Once the modulated RF signal is received by an antenna, the demodulation process of ATSC/NTSC/PAL/VSB/SSB according to the prior art starts by amplifying the modulated RF signal with a low noise amplifier (LNA). Subsequently a mixer is applied to transfer the frequency of the modulated RF signal to an intermediate frequency (IF), then a sharp passband (IF) filter is then used to filter out unwanted RF signals at frequencies adjacent to the frequencies of a selected channel. And then convert to the baseband signal and recover the original signal. One of the primary uses with this demodulation process is that the sharp passband (IF) filter is required to filter out unwanted RF signals. The sharp passband (IF) filter requires complicated circuitry and a multitude of components, and is power consuming. An Imaging Rejection Circuit may reduce the rejection requirement of a sharp filter, but the sharp filter is still needed in order to meet the high requirement of the adjacent channel rejection. Moreover, the imaging rejection is also a very complicated circuit specifically for wide channel distribution such as video transmission channel from 40 MHz to 800 MHz.

In recent years, the development of computer and communications related technologies have grown rapidly, therefore conventional demodulation technology used in systems such as QAM, QPSK, OFDM, GSM, CDMA no longer requires a sharp passband (IF) filter because they are implemented with a zero-IF (intermediate frequency) demodulation method. In a system implemented with the zero-IF demodulation method, a modulated RF signal is mixed with a sinusoidal wave of the carrier frequency of the modulated RF signal with mixers to generate I (in-phase) and Q (quadrature-phase) components. Because the modulated RF signal is mixed with the sinusoidal wave of the carrier frequency, the I and Q components will be baseband components. The sharp filter is implemented in Base Band frequency. Due the low frequency of Base Band signal, the sharp Base Band filters are more easily implemented than prior art and can be integrated in to an Integrate Chip or a Mixed IC. This saves a lot of circuitry and components for QAM, QPSK, OFDM, GSM, and CDMA system. But thus far, demodulations in the ATSC system, NTSC system, PAL system, VSB modulation system, and SSB modulation system which only contain a portion of double baseband signal are still implemented with sharp passband (IF) filters. Thus they need much more complicated circuitry, external components such as SAW and are very power consuming, and thus cannot be easily integrated onto an SOC (system-on-chip).

SUMMARY OF THE INVENTION

According to an embodiment of the present invention, a method for recovering a baseband signal from an RF signal comprises a tuner receiving an RF signal comprising a modulated baseband signal, a carrier of a carrier frequency, an adjacent channel signal, and noise; a low noise amplifier (LNA) amplifying the RF signal; mixing the RF signal with a first sinusoidal wave with the carrier frequency to generate a first low frequency component; mixing the RF signal with a second sinusoidal wave orthogonal to the first sinusoidal wave to generate a second low frequency component; filtering the first low frequency component to filter out Adjacent Channel Signal and noise outside the bandwidth so as to generate a first modulated baseband component of the modulated baseband signal; filtering the second low frequency component to filter out Adjacent Channel Signal and noise outside the bandwidth so as to generate a second modulated baseband component of the modulated baseband signal; forming a Complex Number signal from the first modulated baseband component and the second modulated baseband component of the modulated baseband signal; and generating a Real Number signal of a Shifted Complex Number signal from the Complex Number signal.

These and other objectives of the present invention will no doubt become obvious to those of ordinary skill in the art after reading the following detailed description of the preferred embodiment that is illustrated in the various figures and drawings.

DETAILED DESCRIPTION

In this embodiment, a Single Side Band modulation system is used to describe the approach. Other modulation systems such as VSB/ATSC/NTSC/PAL whose modulated RF signals do not contain complete baseband signals can be implemented in likewise manners and are also within the scope of the invention.

Figure 1:
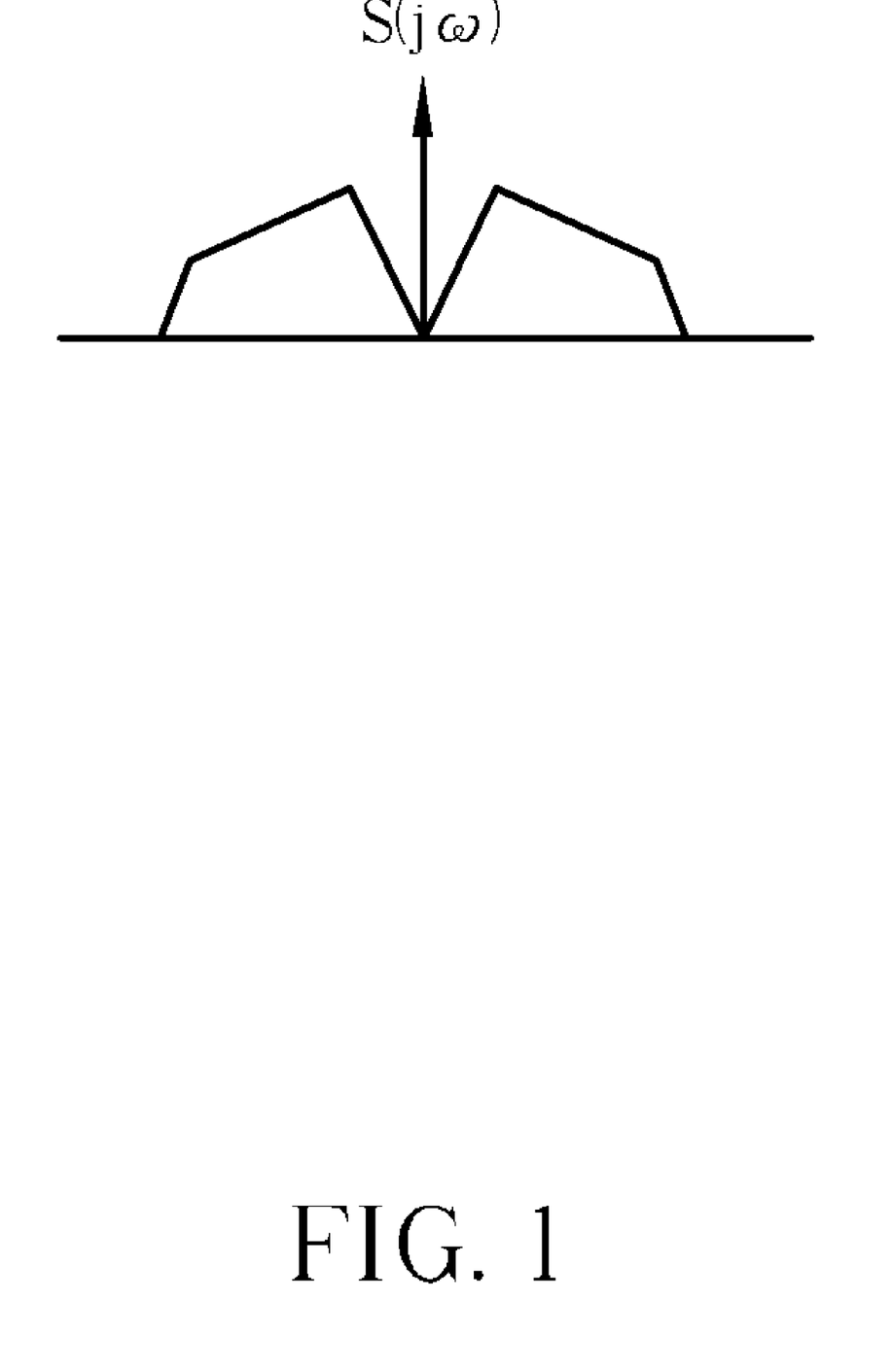
FIG. 1 is a diagram of a real number baseband signal S(t) whose signal S($\omega$) in frequency domain is Hermitian symmetrical about zero frequency according to the present invention.
Figure 2:
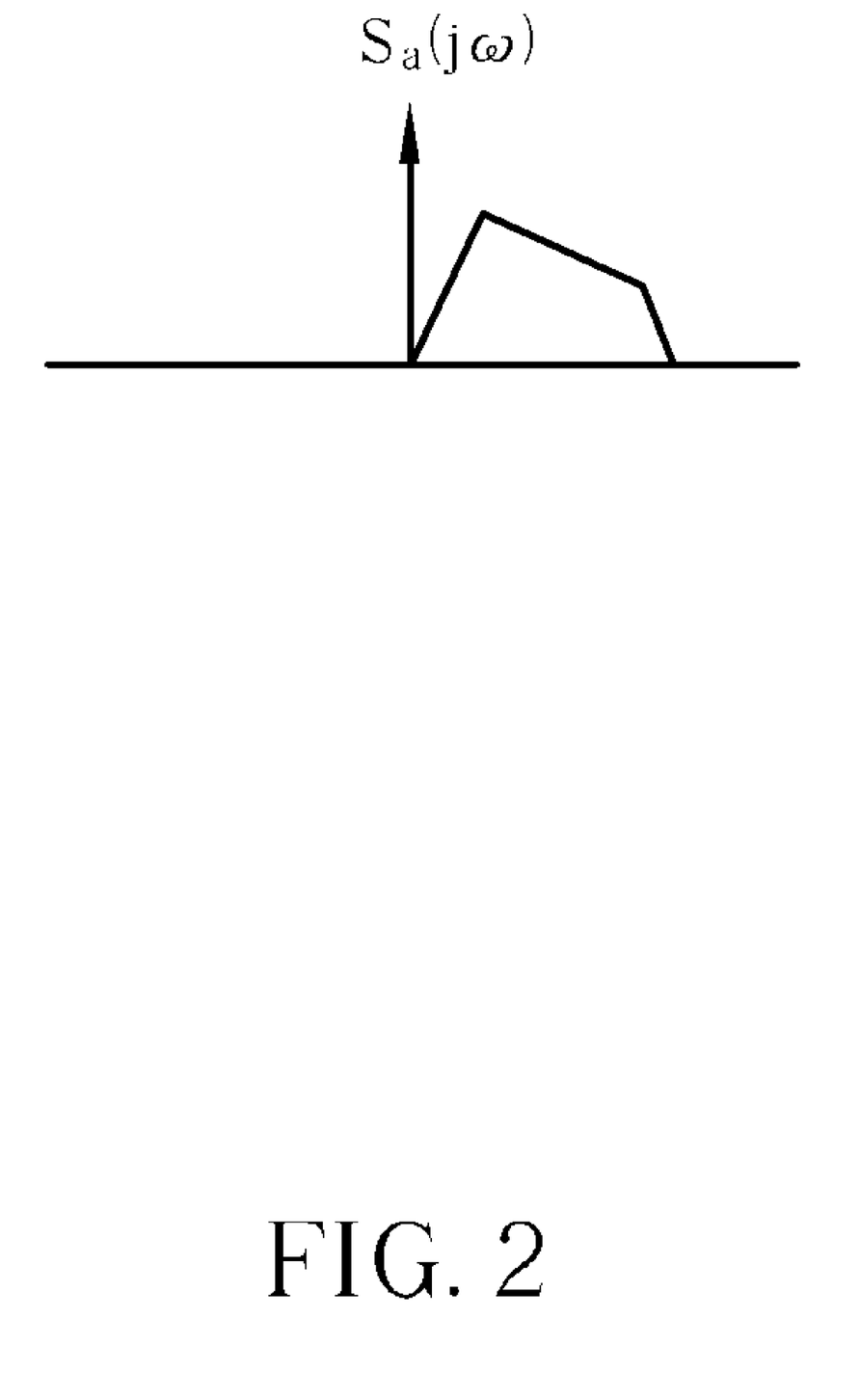
FIG. 2 is a diagram of an analytic signal $S_a(t)$ of S(t) according to the present invention.

The Single Side Band modulation can be modeled by an Analytic approach. From the Fourier Theory, if S(t) is a real number baseband signal, then its frequency domain signal S(ω) is Hermitian symmetrical about the zero frequency as shown on FIG. 1. Therefore to model the modulation process, we can use the analytic signal $S_a(t)$ of S(t). Please refer to FIG. 2 and the following equation:

$$s_a(t)=s(t)+j\hat{s}(t) \quad \text{Equation (1)}$$

where ŝ(t) is Hilbert transform of s(t).

Then we shift $S_a(t)$ signal to the modulated frequency as:

$$z(t)=s_a(t)e^{j\omega_c t}=s_{ssb}(t)+js_{s\hat{s}b}(t) \quad \text{Equation (2)}$$

where Z(t) is $S_a(t)$ to be shifted by $e^{j\omega_c t}$.

which means all frequency components are shifted by $+f_c$ frequency, so there are no negative-frequency components.

Figure 3:
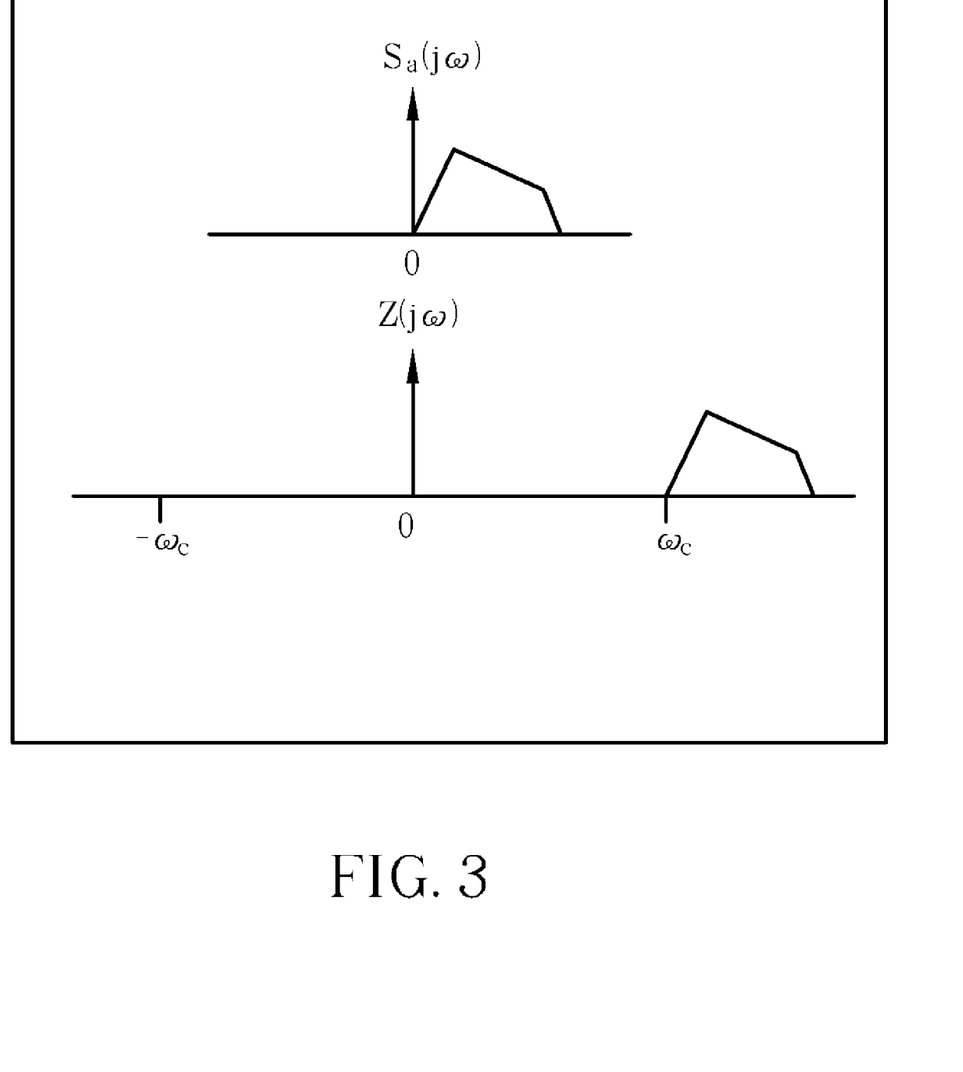
FIG. 3 is a diagram of an analytic signal Z(t) which is the frequency shifted signal of $S_a$ signal.
Figure 4:
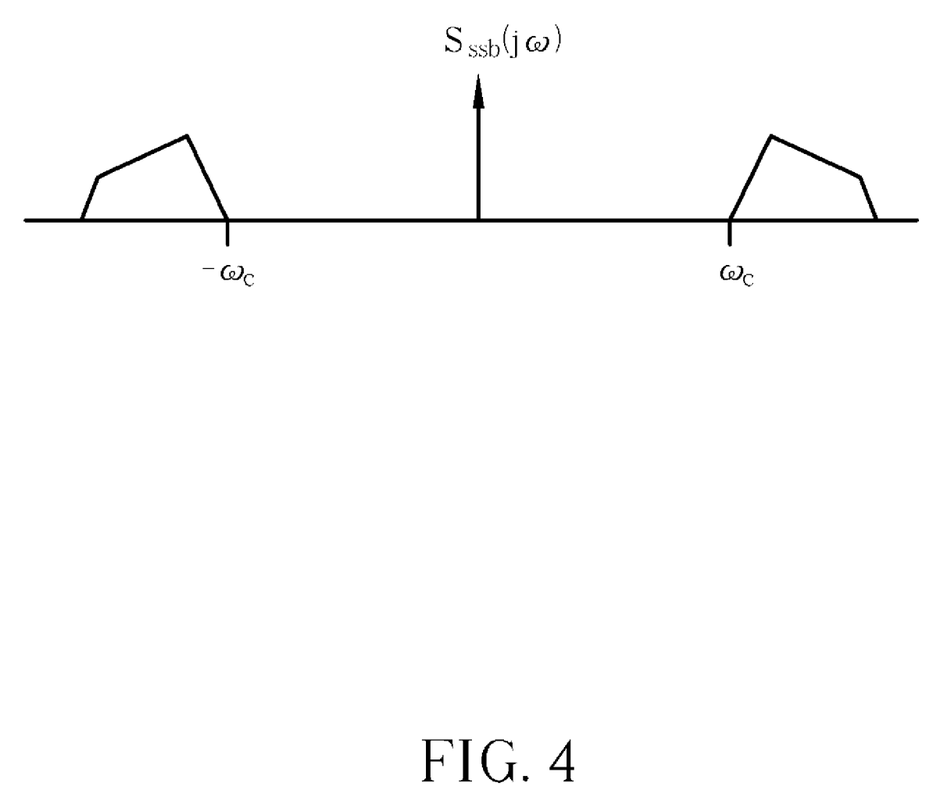
FIG. 4 is a diagram of a single sideband signal $S_{ssb}(t)$ which is a Real Number part of Z(t). This signal is used as the mathematical model of Sideband signal modulated at $\omega_c$.

Please refer to FIG. 3. Note that Z(t) shown on FIG. 3 is still an analytic signal and has no negative frequency components. Since Z(t) is a Complex Number, it cannot be sent through a channel. The Single Side Band Modulation signal $S_{ssb}(t)$ shown on FIG. 4 can be modeled by simply picking the real number of Z(t). And $S_{ssb}(t)$ can be used as a model of Single Side Band modulation signal or other modulation signal such as VSB/ATSC/NTSC/PAL. The equation of $S_{ssb}(t)$ can be derived as follows:

$$s_{ssb}(t) = \text{Re}\{Z(t)\} = \text{Re}\{s_a(t) \cdot e^{j\omega_c t}\} \quad \text{Equation (3)}$$
$$= \text{Re}\{[s(t)+j\hat{s}(t)] \cdot [\cos(\omega_c t)+j\sin(\omega_c t)]\}$$
$$= s(t)\cos(\omega_c t) - \hat{s}(t)\sin(\omega_c t)$$

Figure 5:
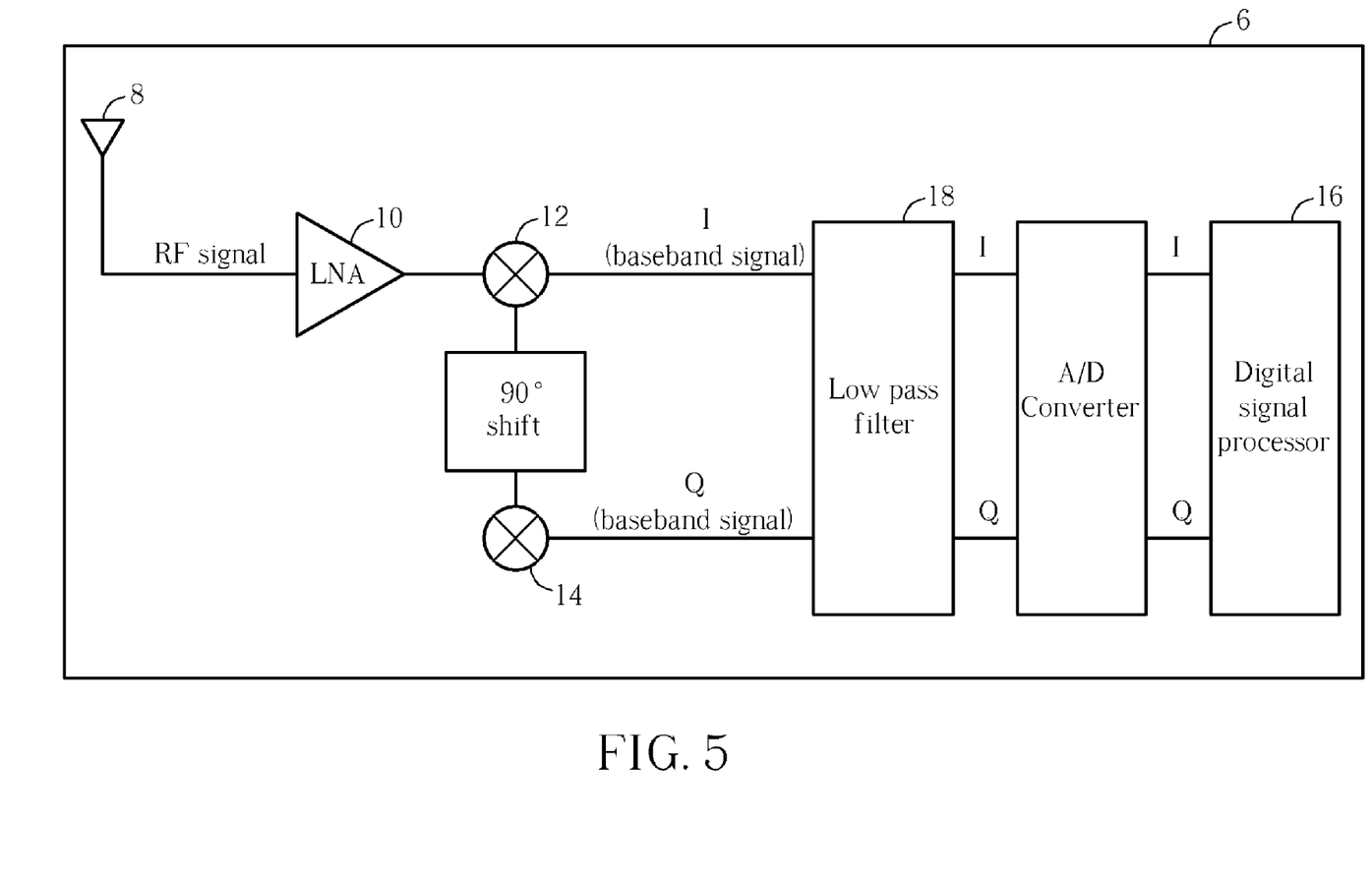
FIG. 5 is a block diagram of demodulation according to the present invention.

Please refer to FIG. 5. FIG. 5 is a block diagram of a receiver 6 according to the present invention. The receiver 6 comprises an antenna 8, an LNA (Low Noise Amplifier) 10, a first mixer 12, a second mixer 14 orthogonal to the first mixer 12, a DSP (Digital Signal Processor) 16, and a low pass filter 18. The detailed description of demodulation process is given below.

Figure 6:
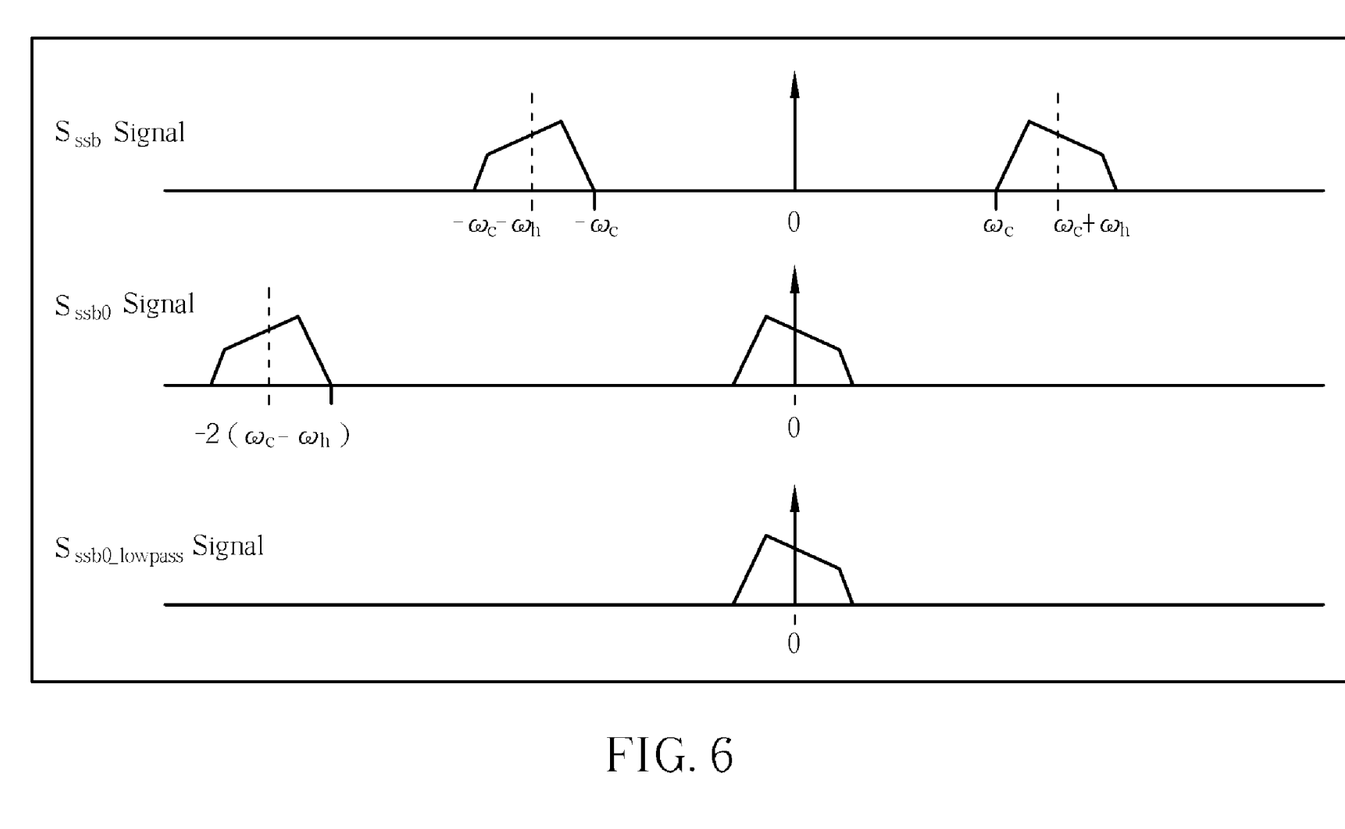
FIG. 6 is a diagram of a process of converting $S_{ssb}(t)$ into $S_{ssb0}(t)$ by shifting frequency $e^{i(-\omega_c-\omega_h)t}$ and of passing a low pass filter as $S_{ssb0\_lowpass}$.

Please refer to FIG. 6. In order to recover the $S_{ssb}(t)$, we need to convert $S_{ssb}(t)$ into Complex number Base Band $S_{ssb0}(t)$ by shifting frequency $e^{j(-\omega_c-\omega_h)t}$ through the first mixer 12 and the second mixer 14 as the following equation (4) represents, and FIG. 6 shows the shifting processing.

$$s_{ssb0}(t) = s_{ssb}(t)e^{-j(\omega_c+\omega_h)t} \quad \text{Equation (4)}$$

$$= \frac{1}{2}\begin{bmatrix} \begin{pmatrix} s(t)\cos(-\omega_h)t + s(t) \\ \cos(2\omega_c + \omega_h)t - s(t) \\ \sin(-\omega_h)t - \hat{s}(t)\sin(2\omega_c+\omega_h)t \end{pmatrix} + \\ j\begin{pmatrix} s(t)\sin(-\omega_h)t - s(t)\sin(2\omega_c+\omega_h) \\ t + \hat{s}(t)\cos(-\omega_h)t \\ s(t)\cos(2\omega_c+\omega_h)t \end{pmatrix} - \end{bmatrix}$$

where $\omega_h$ is the half frequency bandwidth of base band.

After the Low pass filter 18 performed in the following equation (5), we get $S_{ssb0\_lowpass}(t)$ signal.

$$s_{ssb0\_lowpass}(t) = \frac{1}{2}[(s(t)\cos(-\omega_h)t - \hat{s}(t)\sin(-\omega_h)t) + j(s(t)\sin(-\omega_h)t + \hat{s}(t)\cos(-\omega_h)t)] \quad \text{Equation (5)}$$

For Direct Down, the I channel signal can be gotten by the following equation (6):

$$\text{I\_channel} = s_{ssb}(t)\cos(-(\omega_c+\omega_h))t \quad \text{Equation (6)}$$
$$= (s(t)\cos(\omega_c t) - \hat{s}(t)\sin(\omega_c t))$$
$$\cos(-(\omega_c+\omega_h)t)$$
$$= \frac{1}{2}\begin{pmatrix} s(t)\cos(-\omega_h t) + s(t) \\ \cos(2\omega_c+\omega_h)t - \hat{s}(t)\sin(-\omega_h t) - \\ \hat{s}(t)\sin(2\omega_c+\omega_h)t \end{pmatrix}$$
$$\approx \frac{1}{2}(s(t)\cos(-\omega_h t) - \hat{s}(t)\sin(-\omega_h t))$$
$$= \frac{1}{2}(s(t)\cos\omega_h t + \hat{s}(t)\sin\omega_h t)$$

And for Q channel, the Q channel signal can be gotten by the following equation (7):

$$\text{Q\_channel} = s_{ssb}(t)\sin(-(\omega_c+\omega_h))t \quad \text{Equation (7)}$$
$$= (s(t)\cos(\omega_c t) - \hat{s}(t)\sin(\omega_c t))$$
$$\sin(-(\omega_c+\omega_h)t)$$
$$= \frac{1}{2}(s(t)\sin(-\omega_h)t + \hat{s}(t)\cos(-\omega_h)t)$$
$$= \frac{1}{2}(-s(t)\sin\omega_h t + \hat{s}(t)\cos\omega_h t)$$

After digitizing the I signal which is equation (6) and Q signal which is equation (7), the Complex Number of $S_{ssb0\_lowpass}$ signal which is the equation (5) can be formed by these two signals through the Digital Signal Processor (DSP) 16.

Figure 7:
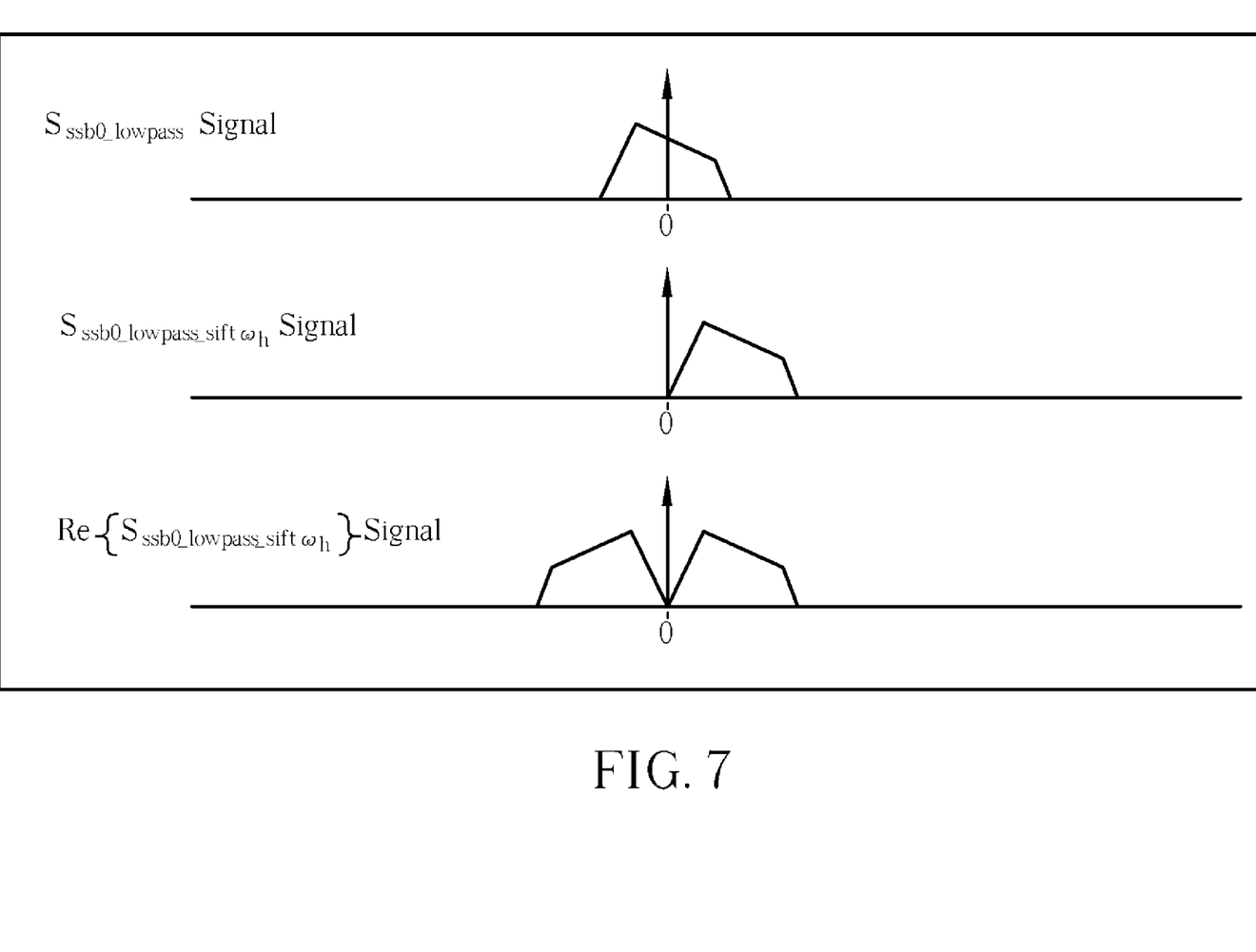
FIG. 7 is a diagram of shifting and the recovered signal is the Real Part of $S_{ssb0\_lowpass\_shift\omega_h t}$.

$S_{ssb0\_lowpass}$ is derived by shifting $S_{ssb0\_lowpass}$ by $e^{j\omega_h t}$ performed in the DSP 16. The Real Part of $S_{ssb0\_lowpass\_shift\omega_h t}$ is the recovered signal derived through the digital signal processing in the DSP 16. Please refer to FIG. 7. FIG. 7 is a diagram of shifting and taking the Real Part of $S_{ssb0\_lowpass\_shift\omega_h t}$. The following equation (8) describes the shifting processing:

$$s_{ssb0\_lowpass\_shift\omega_h}(t) = \begin{bmatrix} \begin{pmatrix} s(t)\cos(-\omega_h)t - \hat{s}(t) \\ \sin(-\omega_h)t \end{pmatrix} + \\ j\begin{pmatrix} s(t)\sin(-\omega_h)t + \hat{s}(t) \\ \cos(-\omega_h)t \end{pmatrix} \end{bmatrix} \cdot \quad \text{Equation (8)}$$
$$(\cos\omega_h t + j\sin\omega_h t)$$
$$= \frac{1}{2}\begin{bmatrix} s(t)\cos\omega_h t + \hat{s}(t)\sin\omega_h t + \\ j(-s(t)\sin\omega_h t + \hat{s}(t)\cos\omega_h t) \end{bmatrix} \cdot$$
$$(\cos\omega_h t + j\sin\omega_h t)$$
$$= \frac{1}{2}\begin{bmatrix} s(t)(\cos^2\omega_h t + \sin^2\omega_h t) + \\ j\hat{s}(t)(\cos^2\omega_h t + \sin^2\omega_h t) \end{bmatrix}$$
$$= \frac{1}{2}[s(t) + j\hat{s}(t)]$$

By taking Real Part of $S_{ssb0\_lowpass\_shift\omega_h t}$ through the digital signal processing in the DSP 16, we can recover s(t) signal as performed in the following equation (9):

$$s(t)=2*\text{Re}\{s_{ssb0\_lowpass\_shift\omega_h}(t)\} \quad \text{Equation (9)}$$

Alternatively, in another embodiment of the present invention, the steps of shifting and taking the Real Part of $S_{ssb0\_lowpass\_shift\omega_h t}$ can be implemented by performing only the Real Part calculation of the equation (8) in the DSP 16 instead of performing both the Real Part and Imaginary Part calculations and then taking the Real Part of the calculated result as the listed below equation (10):

$$S_{ssb0\_lowpass\_shift\omega_h}(t) = Re\left\{\frac{1}{2}\begin{bmatrix}\begin{pmatrix}s(t)\cos(-\omega_h t) - \hat{s}(t) \\ \sin(-\omega_h)t\end{pmatrix} + \\ j\begin{pmatrix}s(t)\sin(-\omega_h)t + \hat{s}(t) \\ \cos(-\omega_h)t\end{pmatrix}\end{bmatrix} \cdot \\ (\cos\omega_h t + j\sin\omega_h t)\right\}$$ Equation (10)

$$= Re\left\{\frac{1}{2}\begin{bmatrix}\begin{pmatrix}s(t)\cos\omega_h t + \hat{s}(t)\sin\omega_h t + \\ j\begin{pmatrix}-s(t)\sin\omega_h t + \\ \hat{s}(t)\cos\omega_h t\end{pmatrix}\end{pmatrix} \cdot \\ (\cos\omega_h t + j\sin\omega_h t)\end{bmatrix}\right\}$$

$$= Re\left\{\frac{1}{2}\begin{bmatrix}s(t)(\cos^2\omega_h t + \sin^2\omega_h t) + \\ j\hat{s}(t)(\cos^2\omega_h t + \sin^2\omega_h t)\end{bmatrix}\right\}$$

$$= \frac{1}{2}[s(t)]$$

To sum up, in real implementation, after Zero IF conversion, the I channel base band signal which is the Real Part of $S_{ssb0\_lowpass}(t)$ is generated. And the Q channel base band signal is the imaginary part of $S_{ssb0\_lowpass}(t)$. After passing through an Analog to Digital converter, a Digital Signal Processing can be utilized to implement the $S_{ssb0}(t)$ and $S_{ssb0\_lowpass\_shift\omega_h}(t)$. Then take the Real Part of $S_{ssb0\_lowpass\_shift\omega_h}(t)$ signal, can be taken to retrieve the original Base Band signal back.

Compared with QAM, QPSK, OFDM, GSM and CDMA, the modulated signals of SSB/VSB/ATSC/NTSC/PAL only occupy a partial modulated bandwidth, therefore the demodulation methods of SSB/VSB/ATSC/NTSC/PAL are a lot more complicated and not straightforward. The present invention utilizing the zero-IF and IQ interface to recover the modulated signals of SSB/VSB/ATSC/NTSC/PAL not only uses fewer components and reduces power consumption but the entire system also can be much easily implemented in a single chip (SOC).

Those skilled in the art will readily observe that numerous modifications and alterations of the device and method may be made while retaining the teachings of the invention.

What is claimed is:

1. A method for recovering a baseband signal from an RF signal comprising:

receiving the RF signal comprising a modulated baseband signal, a carrier frequency, an adjacent channel signal, and noise;

amplifying the RF signal;

mixing the RF signal with a first sinusoidal wave with the carrier frequency to generate a first low frequency component;

mixing the RF signal with a second sinusoidal wave orthogonal to the first sinusoidal wave to generate a second low frequency component;

filtering the first low frequency component to filter out Adjacent Channel Signal and noise outside a bandwidth so as to generate a first modulated baseband component of the modulated baseband signal;

filtering the second low frequency component to filter out Adjacent Channel Signal and noise outside the bandwidth so as to generate a second modulated baseband component of the modulated baseband signal;

forming a Complex Number signal comprising applying the first modulated baseband component as a Real Part signal and the second modulated baseband component as an Imaginary Part signal; and generating a Real Number signal of a Shifted Complex Number signal from the Complex Number signal, the Shifted Complex Number signal derived from multiplying the sum of the Real Part signal and the Imaginary Part signal of the Complex Number signal with $(e^{j\omega_h t})$, wherein $\omega_h$ is half the bandwidth of the modulated baseband signal, and t is time.

2. The method of claim 1 wherein the step of mixing the RF signal with the first sinusoidal wave with the carrier frequency is implemented by a first mixer.

3. The method of claim 1 wherein the step of mixing the RF signal with the second sinusoidal wave with the carrier frequency orthogonal to the first sinusoidal wave is implemented by a second mixer.

4. The method of claim 1 wherein a Real Number signal of a Shifted Complex Number signal is the recovered baseband signal.

5. The method of claim 1 wherein the step of filtering the first low frequency component is implemented by a first low pass filter.

6. The method of claim 5 wherein the step of filtering the second low frequency component is implemented by a second low pass filter.

7. The method of claim 1 wherein the steps of forming a Complex Number signal from the first modulated baseband component and the second modulated baseband component, and generating a Real Number signal of a Shifted Complex Number signal from the Complex Number signal are performed in a digital signal processor.

8. The method of claim 1 wherein all steps are performed in a TV tuner chip.

9. The method of claim 1 wherein the RF signal is an SSB (Single Side band) or VSB (Vestigial Side band) RF signal.

10. The method of claim 1 wherein the RF signal is the RF signal in an ATSC (Advanced Television Systems Committee) system, NTSC (National Television System Committee) system, or PAL (Phase Alternating Line) system.

* * * * *